(12) United States Patent
Lee

(10) Patent No.: US 7,109,084 B2
(45) Date of Patent: Sep. 19, 2006

(54) FLASH MEMORY DEVICE AND METHOD FOR FABRICATING THE SAME

(75) Inventor: Sang Bum Lee, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/121,495

(22) Filed: May 3, 2005

(65) Prior Publication Data

US 2005/0247987 A1 Nov. 10, 2005

(30) Foreign Application Priority Data

May 6, 2004 (KR) .................. 10-2004-0031863

(51) Int. Cl.
*H01L 21/336* (2006.01)
(52) U.S. Cl. ...................... 438/261; 438/954
(58) Field of Classification Search ............... 438/261, 438/954
See application file for complete search history.

(56) References Cited

U.S. PATENT DOCUMENTS

| 5,436,481 A * | 7/1995 | Egawa et al. ............... 257/324 |
| 6,881,619 B1 * | 4/2005 | Lee et al. ................... 438/216 |
| 7,018,896 B1 * | 3/2006 | Ngo et al. .................. 438/261 |

* cited by examiner

*Primary Examiner*—Jack Chen
(74) *Attorney, Agent, or Firm*—Andrew D. Fortney

(57) ABSTRACT

A flash memory device and a method for fabricating the same is disclosed that reduces or prevents mis-operation and improves integration, which includes a semiconductor substrate having a field region and an active region; a device isolation layer on the field region including a conductive (e.g., polysilicon) layer and an insulating layer thereon; a sidewall spacer at sides of the device isolation layer; an ONO layer on the active region; a gate electrode on the ONO layer; source and drain regions at sides of the gate electrode in the active region; a passivation layer on the semiconductor substrate, having a contact hole in the drain region; and a drain electrode in the contact hole, connected with the drain region.

9 Claims, 9 Drawing Sheets

FLASH MEMORY DEVICE AND METHOD FOR FABRICATING THE SAME

This application claims the benefit of the Korean Application No. P2004-31863 filed on May 6, 2004, which is hereby incorporated by reference.

BACKGROUND OF THE INVENTION

1. Field of the Invention

The present invention relates to a flash memory device and a method for fabricating the same, and more particularly, to a flash memory device and a method for fabricating the same, which is suitable for improving integration in a SONOS (Silicon-Oxide-Nitride-Oxide-Silicon) cell.

2. Discussion of the Related Art

A typical example of a nonvolatile memory device, in which data can be rewritable, is EEPROM (Electrically Erasable Programmable Read Only Memory). Generally, EEPROM devices use a floating gate type cell.

With rapid development of high-integration devices, the size of the floating gate type cell has generally decreased according to the related art. However, beyond a certain size, it is difficult to decrease the cell size since a relatively high voltage is generally used in programming and erasing modes, and it is difficult to obtain sufficient process margin for defining tunneling. For these (and other) reasons, various nonvolatile memory devices such as SONOS, FeRAM, SET and NROM have been studied actively as a substitute for the floating gate type cell. Among them, SONOS cell has attracted great attention as a nonvolatile memory device that can substitute for the floating gate type cell.

Hereinafter, a related art SONOS type nonvolatile memory device will be described with reference to the accompanying drawings.

FIG. 1 is a layout of showing a unit cell of an SONOS type nonvolatile memory device according to the related art. FIG. 2A is a cross sectional view along I–I' of FIG. 1. FIG. 2B is a cross sectional view along II–II' of FIG. 1. FIG. 2C is a cross sectional view of showing a pattern defect due to misalignment.

As shown in FIG. 1, FIG. 2A and FIG. 2B, the unit cell of the SONOS type nonvolatile memory device according to the related art includes a semiconductor substrate 11, a device isolation layer 12, an ONO layer 13, and a gate electrode 14. At this time, the device isolation layer 12 (an STI, or Shallow Trench Isolation, structure) is formed in the semiconductor substrate 11, to divide the semiconductor substrate 11 into a field region and an active region. Also, the ONO layer 13 is formed by sequentially stacking a lower oxide layer 13a, a nitride layer 13b and an upper oxide layer 13c in order, wherein the lower oxide layer 13a is used as a tunnel oxide layer, the nitride layer 13b functions as a memory (storage) layer, and the upper oxide layer 13c functions as a gate dielectric or blocking layer for preventing the loss of electric charges. Then, the gate electrode 14 is formed on the ONO layer 13. In addition, source and drain regions 15a and 15b are formed at both sides of the gate electrode 14 in the active region of the semiconductor substrate 11. Then, a drain contact hole 16 is formed in the drain region 15b, for connection with an upper line.

In this case, the device isolation layer 12 is formed of an insulating layer in an STI (Shallow Trench Isolation) process. Recently, as dimensions in design rules for high integration semiconductor device decrease, the distance between the device isolation layers 12 becomes small. Accordingly, when the drain region 15b is formed in the semiconductor substrate 11 between the device isolation layers 12, a width of the drain region 15b is also decreased, so that it is difficult to obtain a sufficient interval between the drain contact hole 16 and the device isolation layer 12.

In case of misalignment when forming the drain contact hole 16, as shown in FIG. 2C, the drain contact hole 16 may be formed above the device isolation layer 12 as well as above the drain region 15b. That is, when forming the drain contact hole 16, a portion of the semiconductor substrate 11 adjacent to the device isolation layer 12 may be etched, thereby generating junction leakage. Accordingly, the memory device may operate incorrectly or fail.

SUMMARY OF THE INVENTION

Accordingly, the present invention is directed to a flash memory device and a method for fabricating the same that substantially obviates one or more problems due to limitations and disadvantages of the related art.

An object of the present invention is to provide a flash memory device and a method for fabricating the same, in which it is possible to prevent mis-operation by reducing or preventing junction leakage in a drain contact hole, and to improve integration by decreasing a unit cell size in an SONOS type nonvolatile memory device.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flash memory device includes a semiconductor substrate having a field region and an active region; a device isolation layer on the field region of the semiconductor substrate, wherein the device isolation layer comprises a conductive (e.g., polysilicon) layer with an insulating layer thereon; an insulating sidewall spacer at a side of the device isolation layer; an ONO layer on the active region of the semiconductor substrate; a gate electrode on the ONO layer; source and drain regions at sides of the gate electrode in the active region of the semiconductor substrate; a passivation layer on the semiconductor substrate, having a contact hole in the drain region; and a drain electrode in the contact hole, connected to the drain region.

In another aspect, a method for fabricating a flash memory device includes the steps of forming a device isolating layer having a first insulating layer, a conductive (e.g., polysilicon) layer and a second insulating layer on a field region of a semiconductor substrate; forming an insulating sidewall spacer at a side of the device isolation layer; forming an ONO layer on an active region of the semiconductor substrate, and forming a gate electrode on the ONO layer; forming source and drain regions by implanting impurity ions into the active region of the semiconductor substrate using the gate electrode as a mask; forming a passivation layer on an entire surface of the semiconductor substrate; and forming a contact hole in the passivation layer over the drain region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a flash memory device and a method for fabricating the same according to the present invention will be described with reference to the accompanying drawings.

Figure 1:
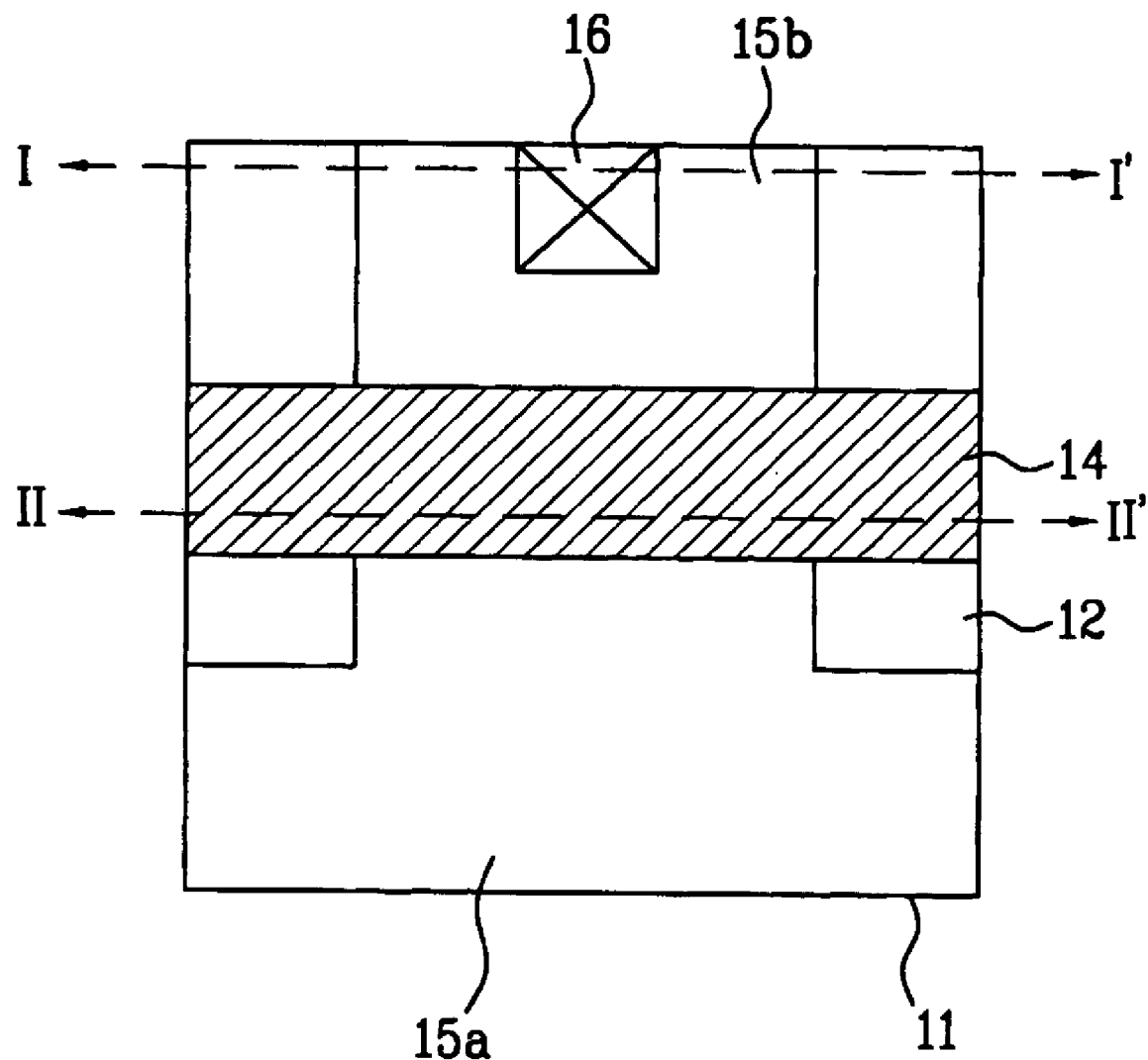
FIG. 1 is a layout of showing a unit cell of an SONOS type nonvolatile memory device according to the related art.
Figure 2A:
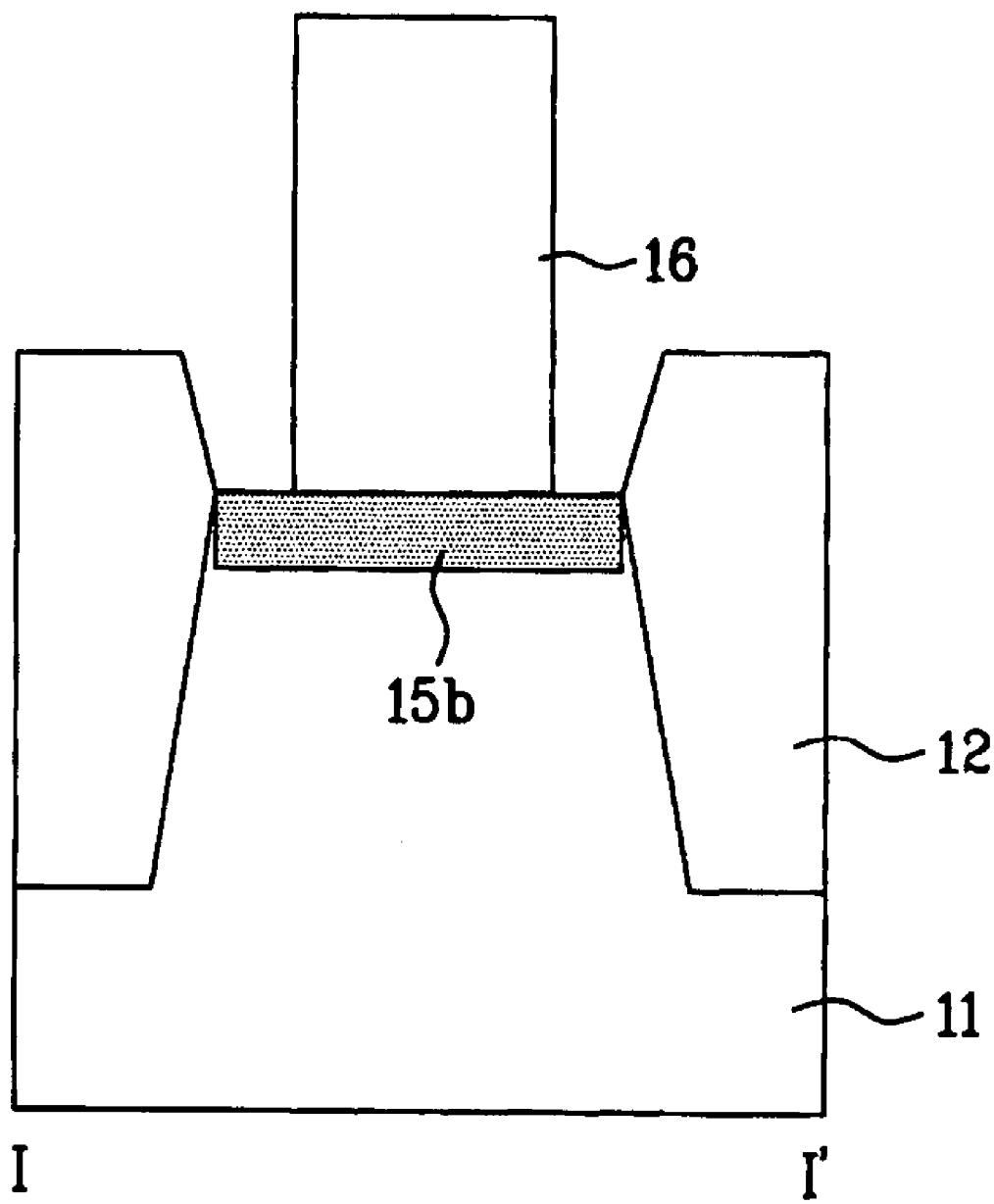
FIG. 2A is a cross sectional view along I–I' of FIG. 1.
Figure 2B:
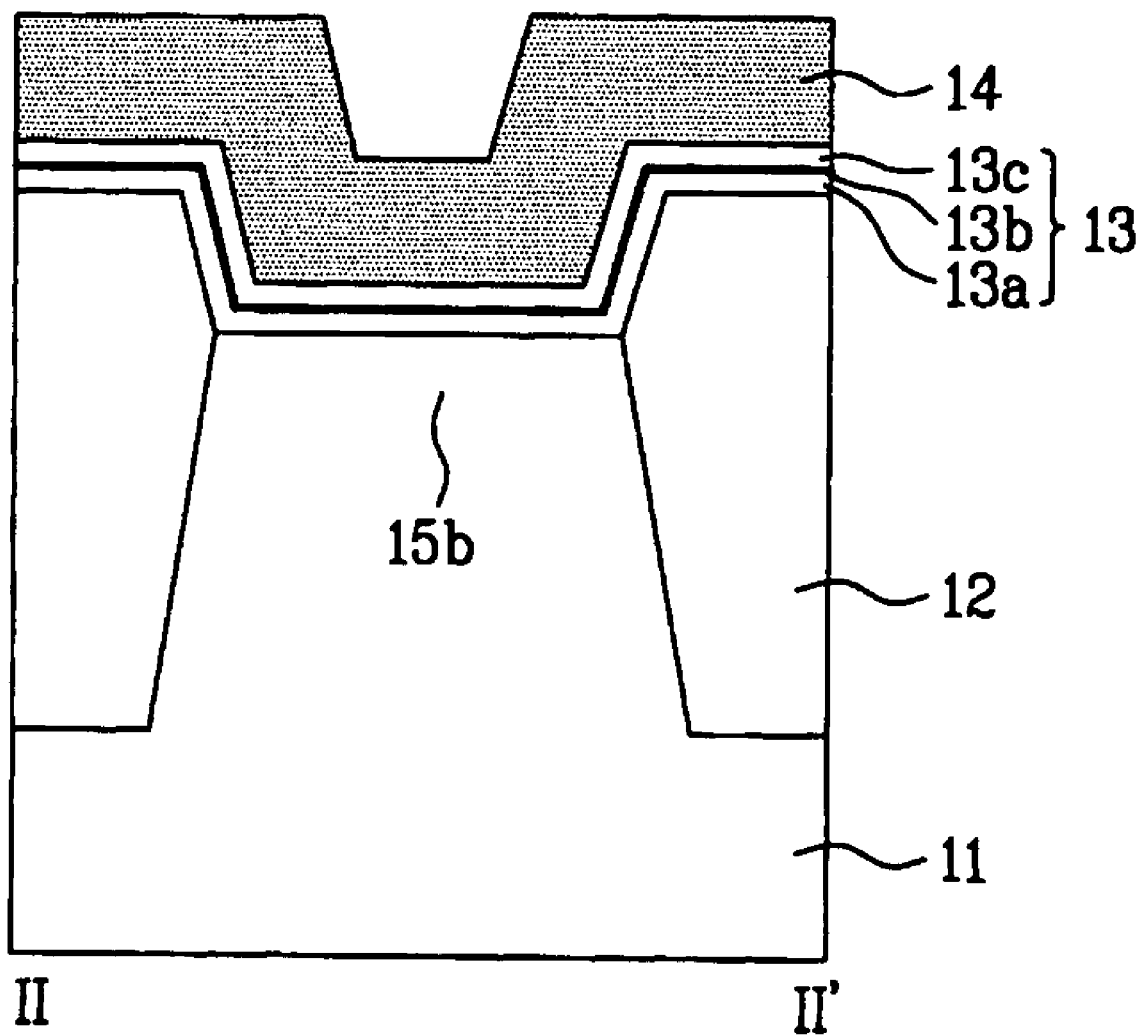
FIG. 2B is a cross sectional view along II–II' of FIG. 1.
Figure 2C:
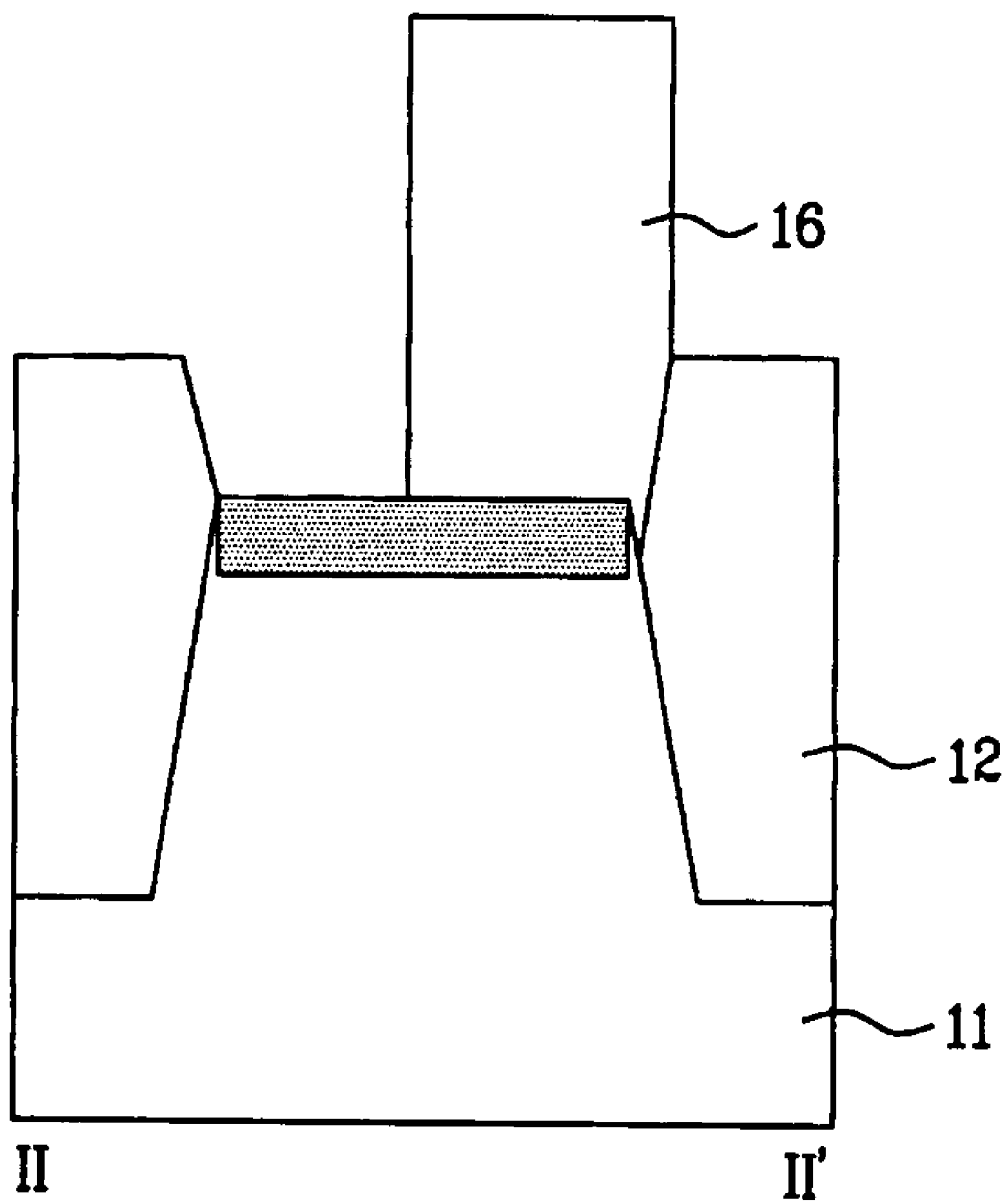
FIG. 2C is a cross sectional view of showing a pattern defect generated due to misalignment.
Figure 3:
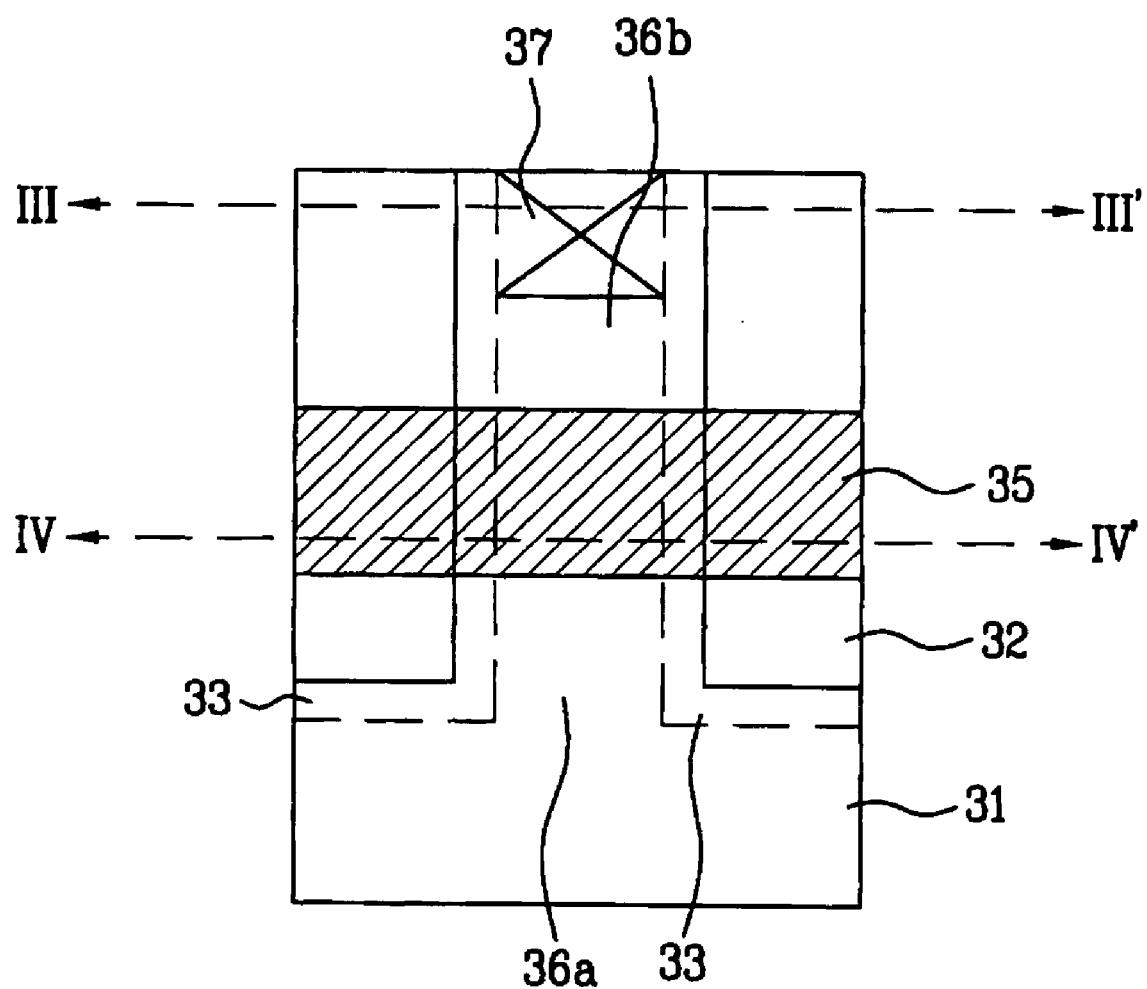
FIG. 3 is a layout of showing a unit cell of an SONOS type nonvolatile memory device according to the present invention.
Figure 4A:
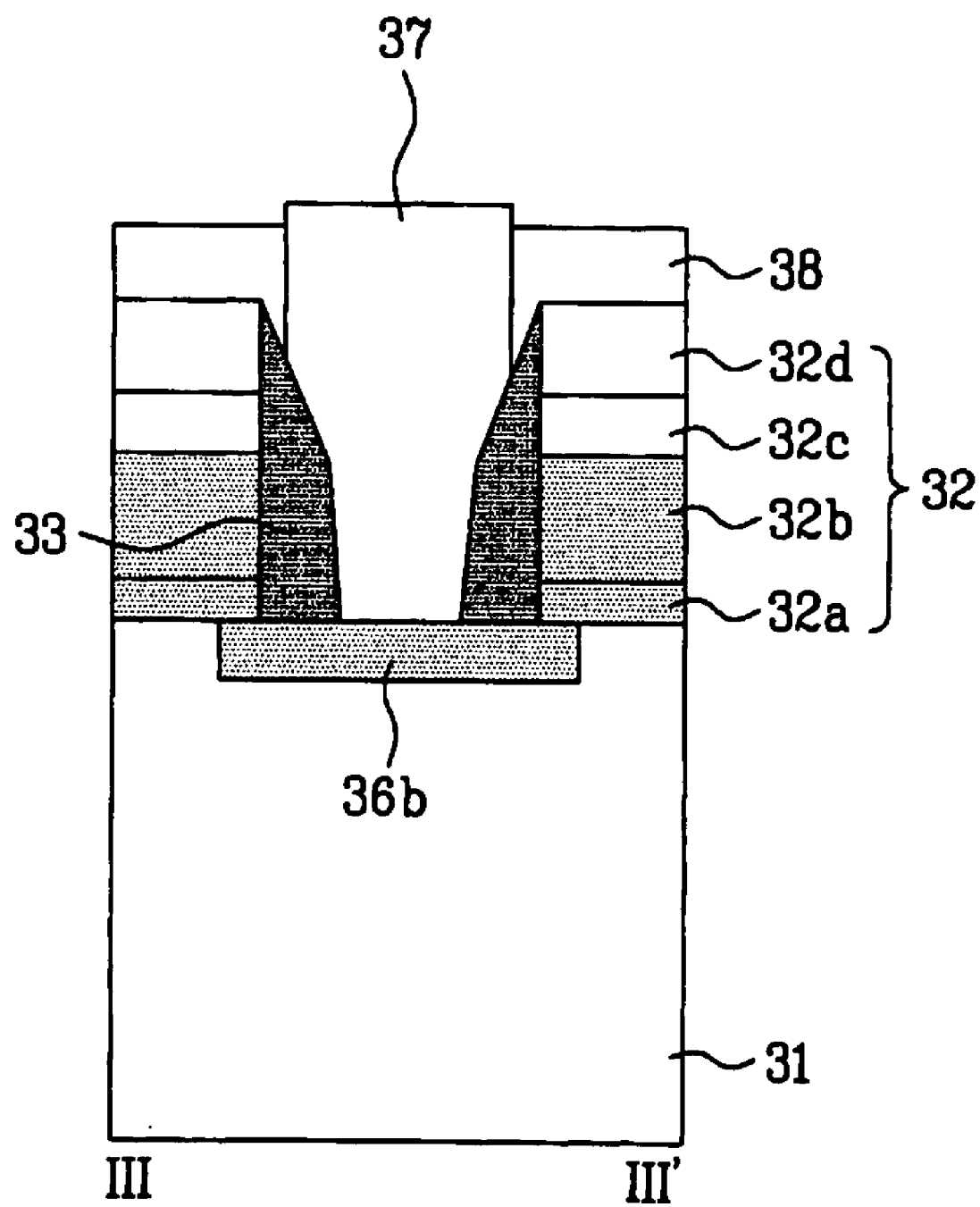
FIG. 4A is a cross sectional view along III–III' of FIG. 3.
Figure 4B:
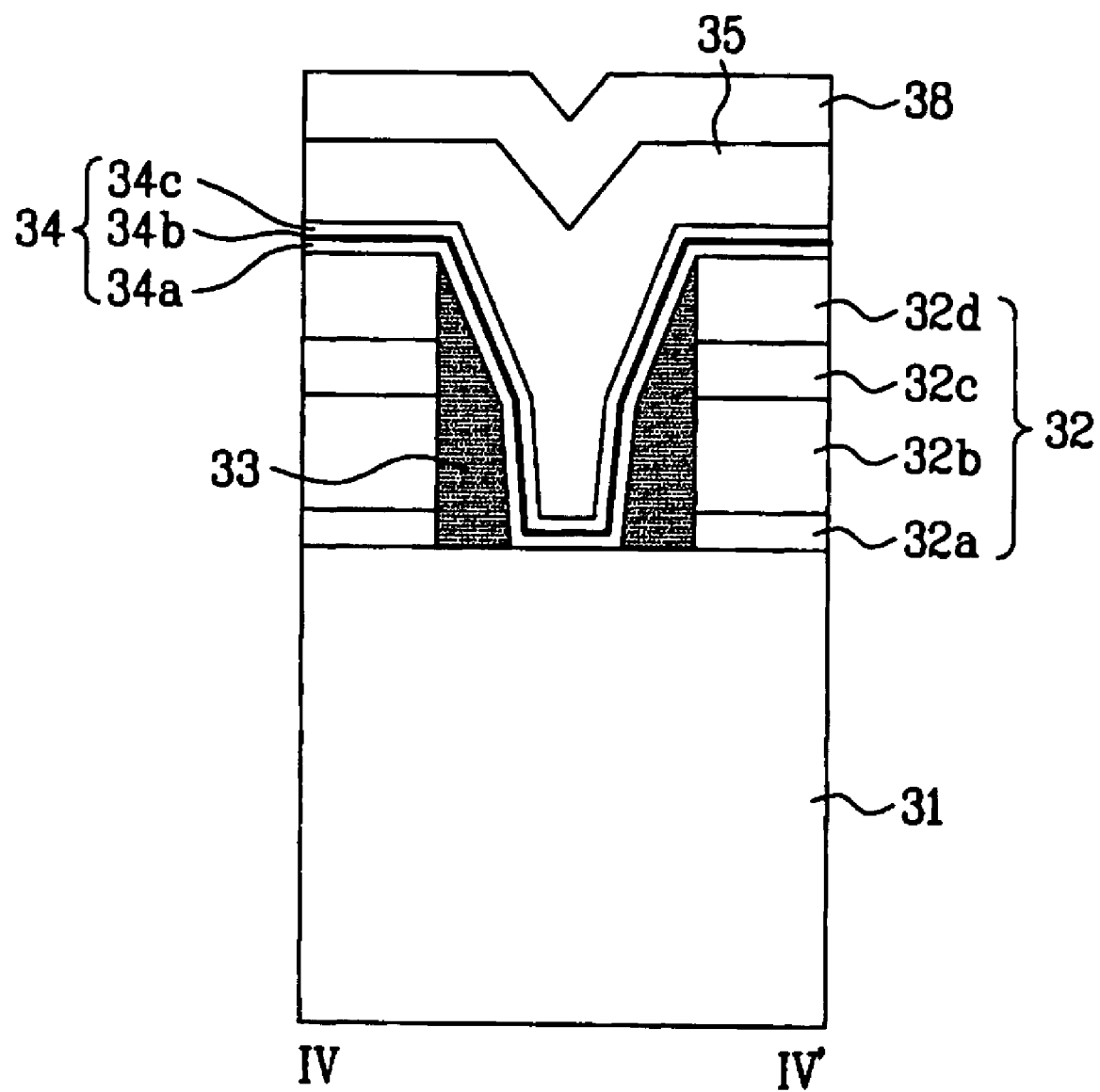
FIG. 4B is a cross sectional view along IV–IV' of FIG. 3.

FIG. 3 is a layout of showing a unit cell of an SONOS type nonvolatile memory device according to the present invention. FIG. 4A is a cross sectional view along III–III' of FIG. 3. FIG. 4B is a cross sectional view along IV–IV' of FIG. 3.

In the unit cell of the SONOS type nonvolatile memory device according to the present invention, as shown in FIG. 3, FIG. 4A and FIG. 4B, there are a semiconductor substrate 31, a device isolation layer 32, insulating sidewall spacers 33, an ONO layer 34, a gate electrode 35, source and drain regions 36a and 36b, a passivation layer 38, and a drain electrode 37. The device isolation layer 32 divides the semiconductor substrate 31 into an active region and a field region. The device isolation layer 32 is in the field region of the semiconductor substrate 31. Generally, the outer borders of device isolation layer 32 define the field region. In this case, the device isolation layer 32 is formed by sequentially stacking an oxide layer 32a, a conductive (e.g., polysilicon) layer 32b, an oxide layer 32c and a nitride layer 32d in order. Also, the insulating sidewall spacers 33 are formed at the side of the device isolation layer 32. Then, the ONO layer 34 is formed across the active region of the semiconductor substrate 31. The ONO layer 34 comprises a lower oxide layer 34a, a nitride layer 34b and an upper oxide layer 34c. Herein, the lower oxide layer 34a generally functions as a tunnel oxide layer, the nitride layer 34b functions as a memory (storage) layer, and the upper oxide layer 34c functions as a blocking layer for preventing the loss of electric charges. After that, the gate electrode 35 is formed on the ONO layer 34. The gate electrode 35 generally comprises a polysilicon layer (which may be [heavily] doped and/or which may further comprise a metal silicide layer thereon) that may be covered with an insulating layer (not shown). Then, the source and drain regions 36a and 36b are formed at both sides of the ONO layer 34 and the gate electrode 35 in the active region of the semiconductor substrate 31. Also, a passivation layer 38 is formed on an entire surface of the semiconductor substrate 31 including the gate electrode 35, and a contact hole is formed in the passivation layer 38 to expose a predetermine portion of the drain region 36b. Accordingly, the drain electrode 37 in the contact hole is connected to the drain region 36b. In this case, the contact hole for connection of the drain electrode 37 in the device isolation layer 32 is self aligned to the insulating sidewall spacers 33 above the drain region 36b. Thus, the contact hole exposes the drain region 36b of the semiconductor substrate 31 and part of the insulating sidewall spacer(s) 33.

Although conductive layer 32b generally comprises polysilicon (which, like gate electrode 35, may be [heavily] doped and/or which may further comprise a metal silicide layer thereon), other conductors, such as aluminum, titanium, titanium nitride, tungsten, metal alloys thereof or other metals or conductive metal compounds may be employed. Also, when conductive layer 32b generally comprises polysilicon, although not shown, an oxide layer may be formed at the side of the polysilicon layer 32b. Furthermore, the conductive layer 32b may be connected with a ground terminal, which generally has the same structure as a ground gate in a general MOS transistor or ground plane in a general MOS integrated circuit.

As mentioned above, the contact hole is self-aligned to the insulating sidewall spacers 33. As a result, it is not necessary to obtain or provide an interval or distance between the contact hole and the device isolation layer 32. Also, as shown in FIG. 4A, the contact hole may expose part of the insulating sidewall spacer(s) 33 over the drain region 36b.

A method for fabricating the aforementioned unit cell of the SONOS type nonvolatile memory device according to the present invention will be described as follows.

Figure 5A:
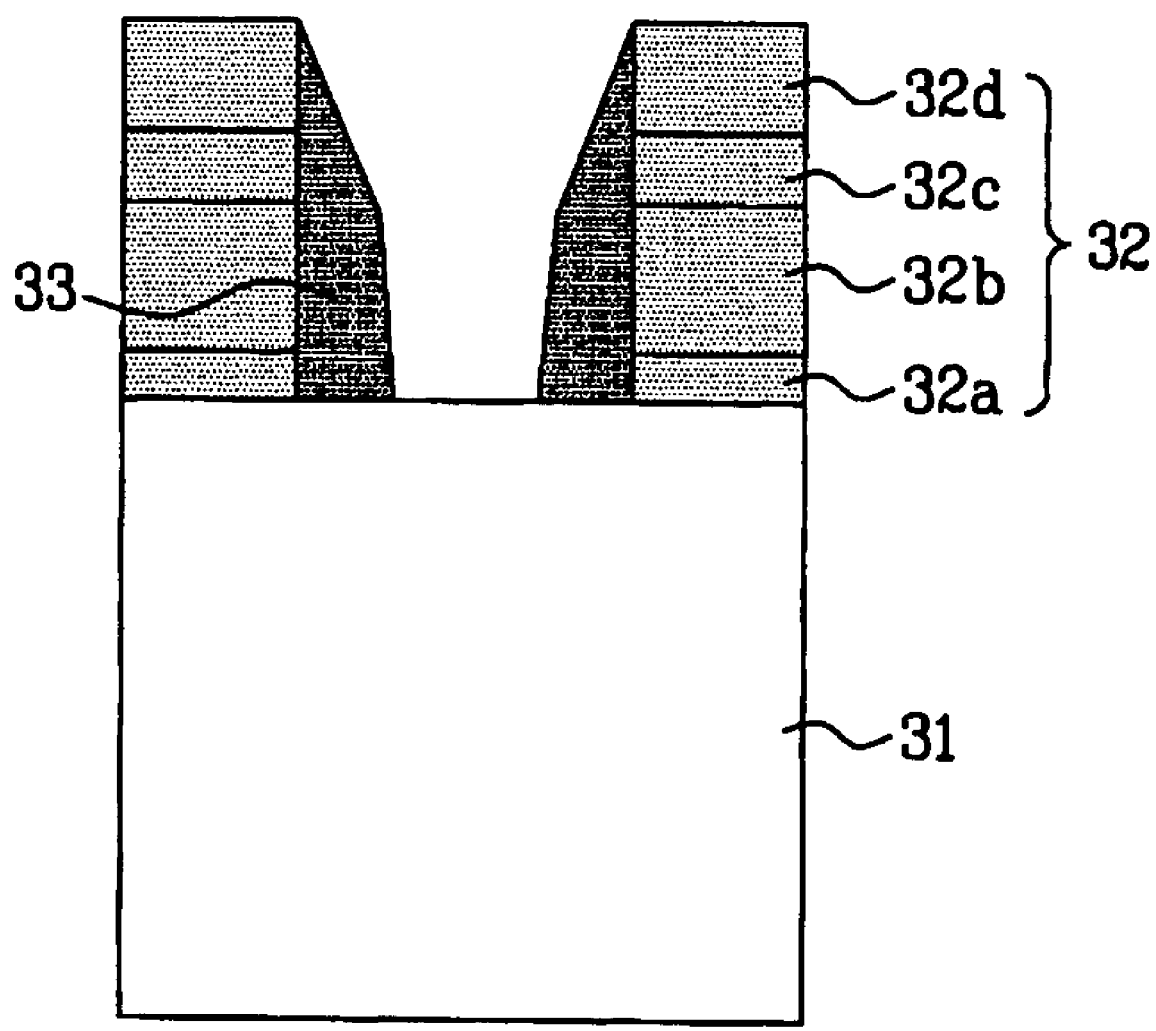
FIG. 5A and FIG. 5B are cross sectional views of showing the process for fabricating a unit cell of an SONOS type nonvolatile memory device, along IV–IV' of FIG. 3, according to the present invention.
Figure 5B:
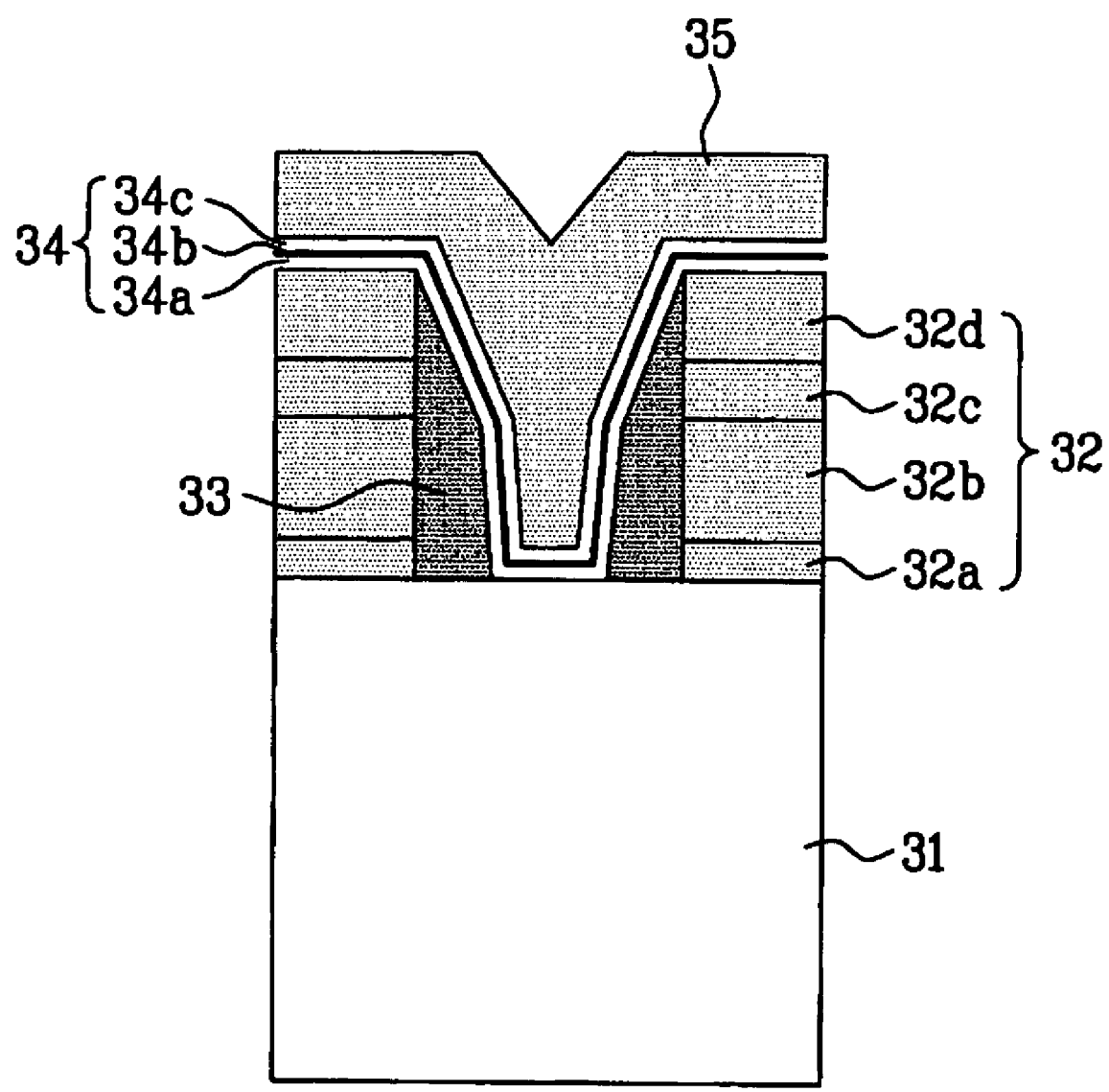

FIG. 5A and FIG. 5B are cross sectional views of showing the process for fabricating the unit cell of the SONOS type nonvolatile memory device, along IV–IV of FIG. 3, according to the present invention.

First, as shown in FIG. 5A, the oxide layer 32a, the conductive (e.g., polysilicon) layer 32b, the oxide layer 32c and the nitride layer 32d are sequentially stacked on the semiconductor substrate 31, the semiconductor substrate 31 having an active region and a field region. Then, portions of the oxide layer 32a, the polysilicon layer 32b, the oxide layer 32c and the nitride layer 32d that are over the active region of the semiconductor substrate 31 are selectively removed, thereby forming the device isolation layer 32.

Subsequently, a well is formed by a doping process (e.g., ion implantation). Then, the polysilicon layer 32b of the device isolation layer 32 may be oxidized, so that an oxide layer (not shown) may be formed at the side of the polysilicon layer 32b.

Next, a spacer insulating material (e.g., a nitride layer) is formed on the entire surface of the semiconductor substrate 31 and then anisotropically etched, thereby forming the insulating sidewall spacers 33 at sides of the device isolation layer 32.

Then, as shown in FIG. 5B, the ONO layer 34 is formed on the entire surface of the semiconductor substrate 31. The ONO layer 34 generally comprises a lower oxide layer 34a, a nitride layer 34b and an upper oxide layer 34c. In this case, the lower oxide layer 34a functions as a tunnel oxide layer, the nitride layer 34*b* functions as the memory (storage) layer, and the upper oxide layer 34*c* functions as the blocking layer for preventing the loss of electric charges. Then, a gate material layer (e.g., comprising polysilicon, which may be [heavily] doped and/or silicided) is formed on the ONO layer 34. After that, portions of the polysilicon layer and the ONO layer 34 are selectively removed to form the gate electrode 35. Then, the gate electrode 35 may be oxidized before forming the source and drain regions.

Subsequently, impurity ions are implanted into the active region of the semiconductor substrate 31 using the gate electrode 35 as a mask, thereby forming the source and drain regions 36*a* and 36*b*, respectively. Then, the passivation layer 38 is formed on the entire surface of the semiconductor substrate 31 including the gate electrode 35 and the source and drain regions 36*a* and 36*b*, and a portion of the passivation layer 38 is selectively removed above the drain region 36*b* to form the contact hole. At this time, the contact hole is formed in the device isolation layer 32 self aligned to the insulating layer sidewall spacers 33.

After that, a conductive material is deposited on the entire surface of the semiconductor substrate 31, and then is selectively removed, whereby the drain electrode 37 is electrically connected with the drain region 36*b* in the contact hole.

After completing the flash memory device, the polysilicon layer 32*b* of the device isolation layer 32 may be connected with a ground terminal.

As mentioned above, the flash memory device and the method for fabricating the same according to the present invention has the following advantages.

First, the contact hole for connection of the drain electrode is formed in the device isolation layer by self alignment. That is, when forming the contact hole, a predetermined portion of the device isolation layer is etched, exposing only the drain region 36*b* of the semiconductor substrate therebelow, thereby reducing or preventing the junction leakage. Accordingly, it is possible to minimize or prevent mis-operation in the flash memory device.

Also, there is no requirement for maintaining a predetermined interval or distance between the drain electrode contact hole and the device isolation layer, so that it is possible to decrease the size of unit SONOS cell, thereby decreasing the entire chip size. Accordingly, it is possible to increase the number of chips or die in each wafer, thereby increasing the gross die per wafer, and thus, the integration of the high-integration flash memory device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a flash memory device comprising:
    forming a device isolating layer having a stack structure comprising a first insulating layer, a conductive layer and a second insulating layer on a field region of a semiconductor substrate;
    forming an insulating sidewall spacer at a side of the device isolation layer;
    forming an ONO layer on an active region of the semiconductor substrate, and forming a gate electrode on the ONO layer;
    forming source and drain regions by implanting impurity ions into the active region of the semiconductor substrate using the gate electrode as a mask; and
    forming a passivation layer on an entire surface of the semiconductor substrate, and forming a contact hole in the passivation layer over the drain region.

2. The method of claim 1, wherein the contact hole exposes the drain region of the semiconductor substrate and part of the insulating sidewall spacer.

3. The method of claim 1, wherein the conductive layer comprises polysilicon.

4. The method of claim 3, further comprising oxidizing a side of the polysilicon layer of the device isolation layer before forming the insulating sidewall spacer.

5. The method of claim 1, further comprising oxidizing an exposed surface of the gate electrode before forming the source and drain regions.

6. The method of claim 1, wherein the first insulating layer comprises a first oxide layer and the second insulating layer comprises a second oxide layer and a nitride layer on the second oxide layer.

7. The method of claim 1, wherein the contact hole is self aligned to the insulating sidewall spacer.

8. The method of claim 1, further comprising forming a drain electrode in the contact hole, connected to the drain region.

9. The method of claim 1, further comprising grounding the conductive layer of the device isolation layer.

* * * * *